(12) United States Patent
Bachl et al.

(10) Patent No.: US 6,860,621 B2
(45) Date of Patent: Mar. 1, 2005

(54) LED MODULE AND METHODS FOR PRODUCING AND USING THE MODULE

(75) Inventors: Bernhard Bachl, Falkensee (DE);
Günter Kirchberger, Sinzing (DE);
Franz Schellhorn, Regensburg (DE);
Martin Weigert, Hardt (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/345,442

(22) Filed: Jan. 10, 2003

(65) Prior Publication Data

US 2003/0142500 A1 Jul. 31, 2003

Related U.S. Application Data

(63) Continuation of application No. PCT/DE01/02565, filed on Jul. 10, 2001.

(30) Foreign Application Priority Data

Jul. 10, 2000 (DE) .......................................... 100 33 502

(51) Int. Cl.[7] .............................. F21V 29/00
(52) U.S. Cl. ................. 362/373; 362/267; 362/294; 313/498; 313/512; 257/98; 257/99; 257/100; 257/710; 257/711; 257/712; 257/713
(58) Field of Search ............................. 362/373, 267, 362/294; 313/498, 512; 257/98–100, 710–713

(56) References Cited

U.S. PATENT DOCUMENTS

| | | | |
|---|---|---|---|
| 4,399,453 A | 8/1983 | Berg et al. .................. 257/712 |
| 5,479,029 A | 12/1995 | Uchida et al. ................ 257/81 |
| 5,528,474 A | 6/1996 | Roney et al. ................ 362/249 |
| 5,782,555 A | 7/1998 | Hochstein .................... 362/373 |
| 5,836,676 A | 11/1998 | Ando et al. .................. 362/244 |
| 5,917,245 A | * 6/1999 | Tomizawa .................... 257/783 |
| 6,060,729 A | * 5/2000 | Suzuki et al. ................. 257/99 |
| 6,428,189 B1 | * 8/2002 | Hochstein ................... 362/373 |
| 6,710,377 B2 | * 3/2004 | Shimomura .................. 257/99 |

FOREIGN PATENT DOCUMENTS

| | | |
|---|---|---|
| DE | 2 315 709 | 10/1974 |
| DE | 40 25 163 A1 | 7/1991 |
| DE | 42 19 132 A1 | 12/1993 |
| DE | 197 14 659 A1 | 10/1998 |
| EP | 0 921 568 A2 | 6/1999 |
| GB | 2 276 032 A | 9/1994 |
| WO | WO 92/15458 | 9/1992 |
| WO | WO 97/37385 | 10/1997 |
| WO | WO 98/42628 | 10/1998 |
| WO | WO 01/47039 A1 | 6/2001 |

OTHER PUBLICATIONS

Niina, T. et al.: "A High–Brightness GaP Green LED Flat–Panel Device for Character and TV Display", IEEE Transactions on Electron Devices, vol. ED–26, No. 8, Aug. 1979, pp. 1182–1186.

(List continued on next page.)

Primary Examiner—Stephen Husar
Assistant Examiner—James W Cranson
(74) Attorney, Agent, or Firm—Laurence A. Greenberg; Werner H. Stemer; Gregory L. Mayback

(57) ABSTRACT

An LED module includes a substrate having good thermal conductivity and one or more radiation-emitting semiconductor components that fixed on the top side of the substrate. The underside of the substrate is fixed on a carrier body having a high thermal capacity, in which the component fixing between the semiconductor components and the substrate and the substrate fixing between the substrate and the carrier body are embodied with good thermal conductivity. Furthermore, the invention relates to a method for producing the LED module, in which metal areas that are suitable as an etching mask improve the impressing of the current required during the anodic bonding, and at the same time, are used as contact areas for contact-connecting the radiation-emitting semiconductor components. The LED module has the advantage that the semiconductor components can be subjected to higher energization as a result of the high thermal capacity of the carrier body.

21 Claims, 3 Drawing Sheets

OTHER PUBLICATIONS

Author not listed: "Superhelle Leuchtdioden erobern neue KFZ–Anwendungen, Power TOPLED ersetzen Kleinglühlampen", [Extra Bright Light–Emitting Diode Conquers New Automobile Application, Power TOPLED Replaces Small Incandescent Lamps], Siemens, Components 34, No. 4, 1996, pp. 1–2.

Kish, F. A. et al.: "High Luminous Flux Semiconductor Wafer–Bonded AlGaInP/GaP Large–Area Emitters", Electronics Letters, vol. 30, No. 21, Oct. 13, 1994, pp. 1790–1792.

* cited by examiner

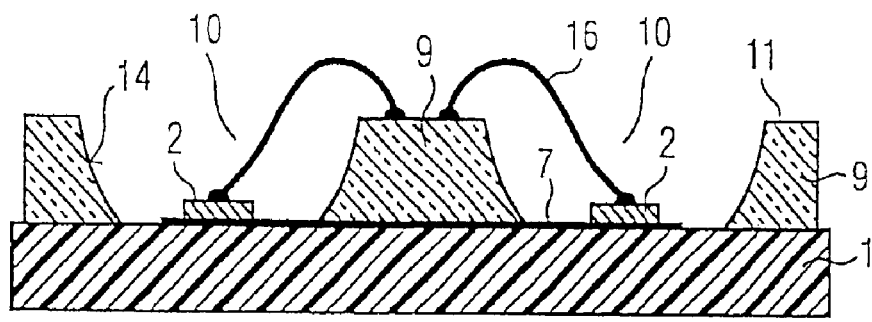
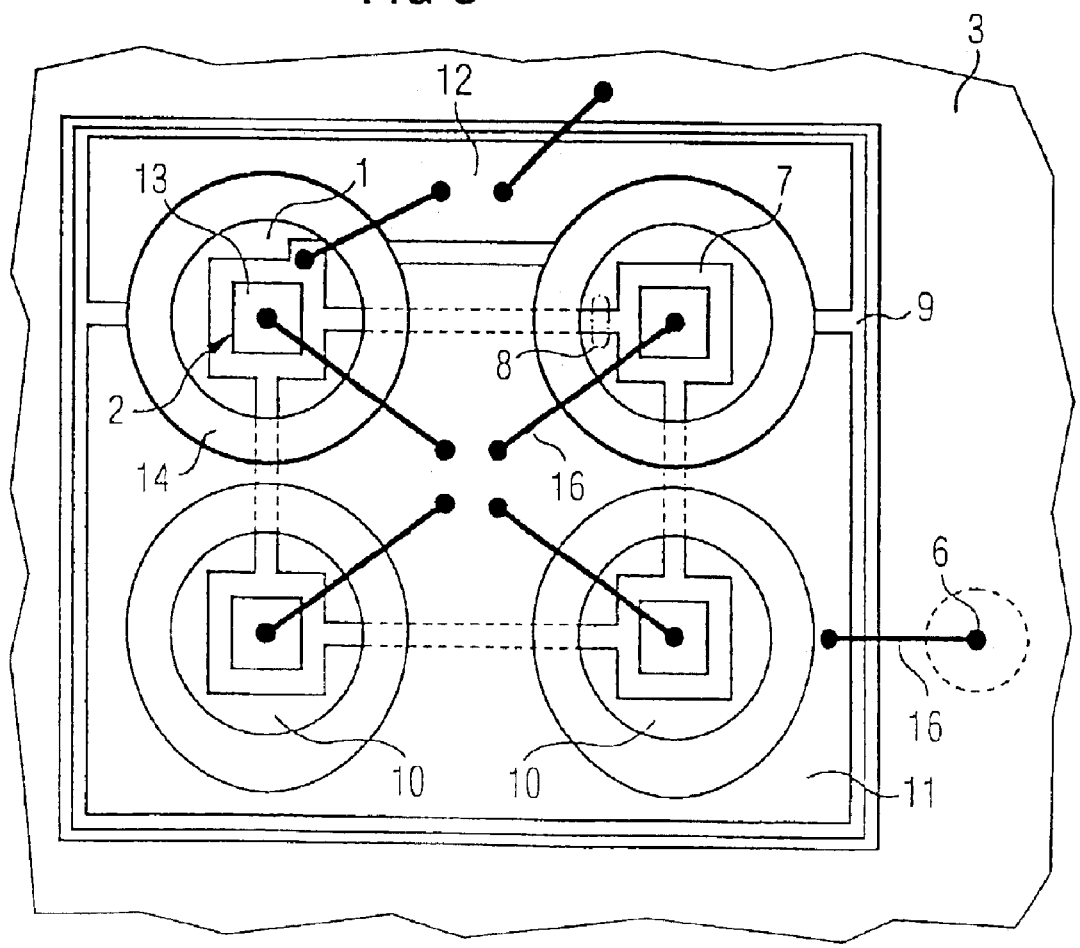

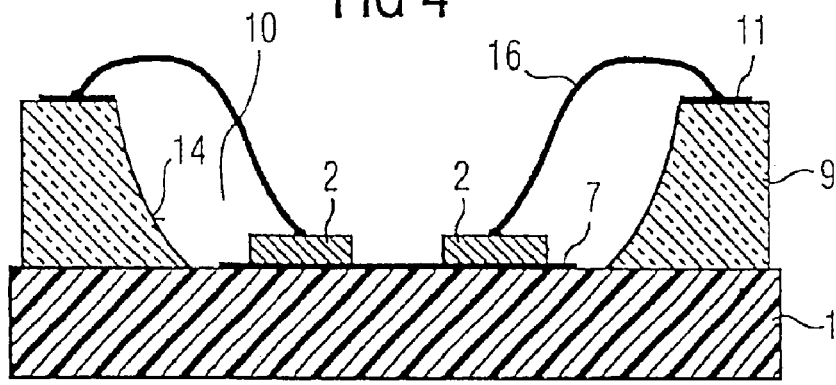
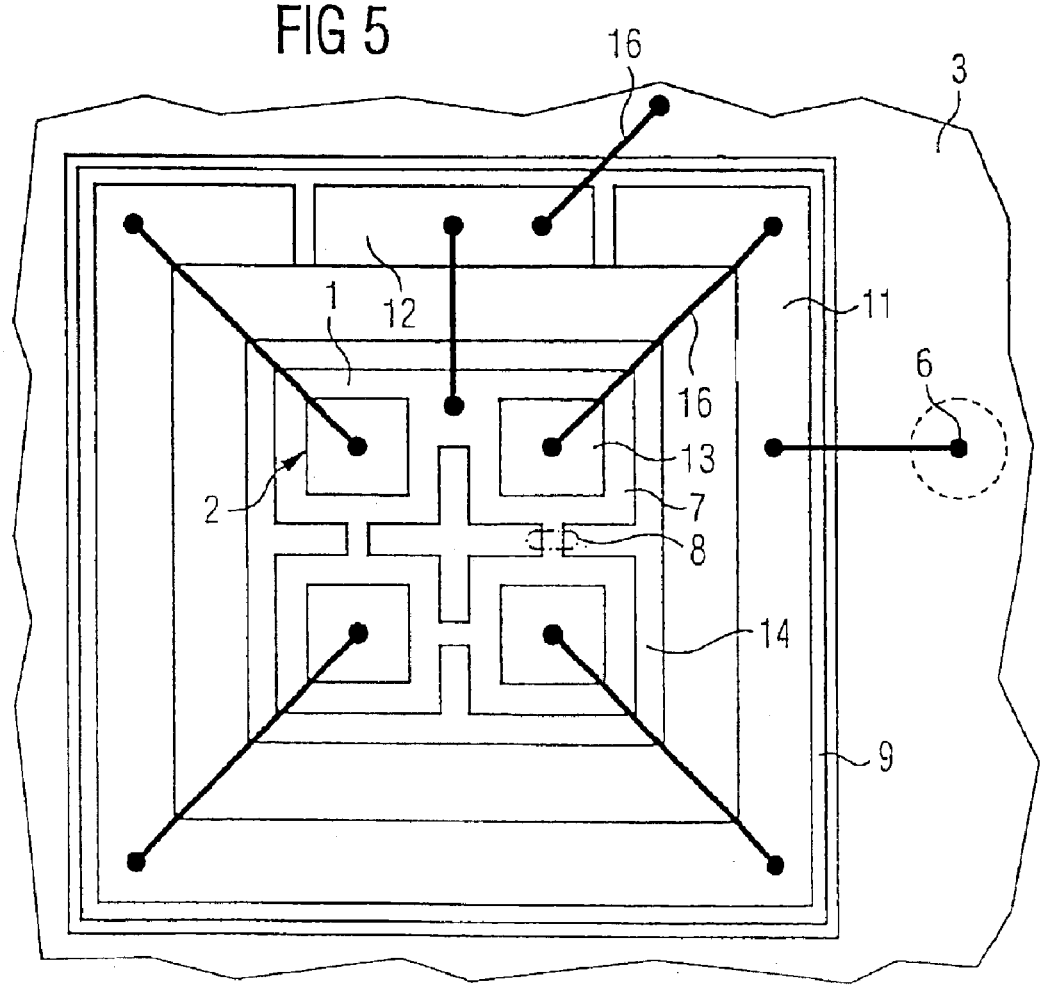

LED MODULE AND METHODS FOR PRODUCING AND USING THE MODULE

CROSS-REFERENCE TO RELATED APPLICATION

This application is a continuation of copending International Application No. PCT/DE01/02565, filed Jul. 10, 2001, which designated the United States and was not published in English.

BACKGROUND OF THE INVENTION

Field of the Invention

The invention relates to an LED module having a substrate and one or more radiation-emitting semiconductor components fixed on the top side of the substrate. Furthermore, the invention relates to a method for producing the LED module and to a method of using the LED module.

Optoelectronic modules are known in which one or more radiation-emitting semiconductor components, for example, light-emitting diodes or laser diodes, are fixed on a substrate. In this case, the substrate has only a very low thermal capacity and a high thermal resistance or a poor thermal conductivity. Consequently, the heat generated during operation of the radiation-emitting semiconductor components can be dissipated only poorly, as a result of which the semiconductor components are correspondingly heated.

The known optoelectronic modules have the disadvantage that, on account of the heating, they can only be operated with a relatively low current of about 10–50 mA. Therefore, the quantity of light radiated by the known modules is very limited, as a result of which the modules are, for example, only poorly suited to laterally coupling light into an optical waveguide. The known optoelectronic modules thus have an insufficient brightness.

SUMMARY OF THE INVENTION

It is accordingly an object of the invention to provide an LED module which overcomes the above-mentioned disadvantages of the prior art apparatus of this general type.

In particular, it is an object of the invention to provide an LED module whose radiation-emitting semiconductor components can be operated with a high current.

With the foregoing and other objects in view there is provided, in accordance with the invention, an LED module for illumination systems or signaling systems, in which the module includes: a thermally conductive substrate having a top side and an underside; at least one radiation-emitting semiconductor component fixed on the top side of the substrate; a carrier body having a high thermal capacity, the underside of the substrate fixed on the carrier body; a first component fixing located between the semiconductor component and the substrate; and a second component fixing located between the substrate and the carrier body. The first component fixing and the second component fixing each have a good thermal conductivity such that heat produced during operation is dissipated via the carrier body.

In other words, the invention specifies an LED module having a substrate with a good thermal conductivity, and one or more radiation-emitting semiconductor components that are fixed on the top side of the substrate. The underside of the substrate is fixed on a carrier body having a high thermal capacity. The component fixing between the semiconductor components and the substrate, in the same way as the substrate fixing between the substrate and the carrier body, is embodied with good thermal conductivity. What is thus achieved is that the heat produced during operation in the semiconductor components is essentially dissipated via the carrier body. This does not, of course, rule out a situation in which some of the heat can also be dissipated by radiation or convection.

In this case, changes in the temperature of the component and associated thermally governed strains are kept small on account of the high thermal capacity of the carrier body. A high thermal capacity is to be understood to mean, in particular, the thermal capacity of a metallic carrier. Furthermore, semiconductor-based carriers, for example carriers containing silicon or gallium arsenide and also ceramic carriers and metal-ceramic composite carriers, are suitable as carriers having a high thermal capacity. Materials of this type, which are suitable for heat sinks, are known per se and are not described in further detail here.

The LED module has the advantage that the heat generated during operation of the radiation-emitting semiconductor components is dissipated particularly well by virtue of the good heat conduction between the radiation-emitting semiconductor components and the carrier body having a high thermal capacity. As a result, the radiation-emitting semiconductor components can be operated with a particularly high current of up to 500 mA, depending on the type, thereby resulting in the LED module emitting radiation with a correspondingly high brightness.

The radiation-emitting semiconductor components may be, by way of example, vertically emitting light-emitting diodes or vertically emitting laser diodes. Such diodes have the advantage that the radiation leaves the LED module perpendicularly to the substrate without any further measures, as a result of which the radiation emitted by the module can be coupled into further components, for example optical waveguides, particularly easily.

Furthermore, particular advantage is attached to an LED module in which the carrier body is a metallic carrier, and a contact pin, which is electrically insulated from the carrier body, is arranged in the carrier body. A metallic carrier has the advantage that it has a particularly high thermal capacity and a good thermal conductivity. As a result, the heat generated during operation of the radiation-emitting semiconductor components can be dissipated particularly well. By using the electrically insulated contact pin, the metallic carrier is at the same time suitable as a plug-in connection element for the electrical lead to the LED module.

In a particularly advantageous embodiment, the carrier body may have a TO (Transverse Optical) design, which has the advantage that commercially available TO designs that can readily be obtained can be used without the dedicated development of a special carrier and without any aftertreatment. Such TO designs can also be incorporated into customary housings particularly easily, so that the LED module does not require special adaptations of existing housings.

Furthermore, particular advantage is attached to an LED module in which the semiconductor components in each case have a first pad on their underside. The pad may be contact-connected via the component fixing to a respective contact area arranged on the substrate, thereby producing one of the two required electrical contacts with the semiconductor component.

The contact area arranged on the substrate may have, in a particularly advantageous manner, a free-standing contact area section which is still externally accessible even when the semiconductor component has already been fixed on the contact area, so that a bonding wire, for example, can be fitted there for further contact connection. It goes without saying that it should be taken into account in this case that the component fixing has not only good heat conduction, but also a good electrical conductivity.

Moreover, particular advantage is attached to an LED module in which the substrate is composed of silicon. Silicon is a material of easy and relatively inexpensive availability, which has outstanding heat conduction and is therefore very highly suited to the purpose of the LED module.

Furthermore, it is advantageous if in addition, on the LED module, the top side of the substrate is at least partly covered by a glass body fixed on the substrate. The glass body has at least one depression which uncovers the substrate surface and in which the semiconductor components are arranged on the substrate surface.

The glass body arranged on the substrate has the advantage that, depending on the requirement, it can be configured as a reflector for the light emitted by the semiconductor components or as a cavity for a potting compound that will subsequently be applied on the substrate. As a result, it is possible to optimize either the radiation characteristics or the form of the potting compound or of the lenses produced by the potting compound.

In the case of the LED module, a plurality of semiconductor components may be arranged in a depression in the glass body, or if the glass body has a plurality of depressions, a semiconductor component may also be arranged in each depression. The person skilled in the art will make a suitable selection from these possibilities depending on the requirements made of the LED module, for example, geometrical dimensions or special radiation characteristics.

The form of the glass body having depressions can be produced particularly advantageously by anisotropic, wet-chemical etching. Such a wet-chemical etching process has the advantage that it can be controlled very well and it yields particularly smooth side edges for the depressions.

For the case where a substrate made of silicon is used, it is particularly advantageous to fix the glass body by anodic bonding on the substrate. Anodic bonding is a method that is easy to carry out and yields a particularly stable mechanical connection.

Moreover, particular advantage is attached to an LED module in which the glass body has two mutually insulated conductor areas on its top side. In addition, the semiconductor components have, on their top side, a respective second pad corresponding to the first pad. In this case, the first conductor area on the top side of the glass body is contact-connected to the second pads on the top side of the semiconductor components and to the contact pin of the metallic carrier. This contact connection can be effected using bonding, for example.

In contrast to a direct contact connect-ion of the second pads, which are arranged on the topside of the semiconductor components, to the contact pin, the inventive arrangement has the advantage that long bonding wires which would have to bridge the glass body and would therefore easily tear particularly at sharp edges of the glass body can be dispensed with.

The LED module can be configured particularly advantageously by forming each of the inner areas of the depressions of the glass body as a reflector. The reflectors deflect the radiation emitted by the semiconductor components arranged in the respective depression in such a way that the radiation is radiated from the module perpendicularly to the substrate.

Such inner areas formed as reflectors allow the use of laterally emitting light-emitting diodes or laterally emitting laser diodes as radiation-emitting semiconductor components. Furthermore, the radiation characteristics, for example, the beam width, can be varied as desired within wide limits by suitably configuring the inner areas or the reflector.

The inner areas of the depressions of the glass body can be configured as reflectors in a particularly advantageous manner by being covered by a metal layer, for example, a thin chromium layer. Such a chromium layer can be applied to the inner areas particularly easily by vapor deposition.

Furthermore, particular advantage is attached to an LED module in which the top side of the substrate is potted with an encapsulation enclosing the semiconductor components. Such an encapsulation has the advantage that the semiconductor components and possibly also the bonding wires used for contact connection are shielded from external influences. In order that the radiation can penetrate outward from the semiconductor components, the encapsulation must be transparent in the corresponding wavelength range. What can be achieved by a corresponding shaping of the encapsulation is that an additional lens effect for optimizing the radiation characteristics of the LED module is achieved.

The encapsulation can be realized, for example, by potting the module with a resin (for example, an epoxy resin). Instead of this, however, it is also possible to weld a glazed cap on the top side of the substrate. In the case of a glazed cap, the interspace between the cap and the components may additionally be potted, thereby improving the coupling-out of light from the semiconductor component on account of the reduced sudden change in refractive index, first from the semiconductor to the resin and additionally from the resin to air.

On the other hand, in the case of the glazed cap, by dispensing with potting with a resin, a higher component temperature can be set since there is no longer a dependence on the glass point of the resin in this case. It would also be possible, moreover, to screw on a glazed cap in addition to the potting of the module.

In a particularly advantageous embodiment of the invention, in which light-emitting diodes connected in series with one another are fixed on the substrate, the type and number of the light-emitting diodes are chosen such that the total voltage dropped across them during operation corresponds to the operating voltage of a motor vehicle on-board electrical system. By way of example, it is possible to use six light-emitting diodes each with a voltage drop of 2 V for a 12 V on-board electrical system. It is alternatively possible to use 2 light-emitting diodes each with a 5 V drop and one light-emitting diode with a 2 V voltage drop. This principle can, of course, also be applied to on-board electrical systems with an operating voltage of 42 V. In any event, the operating voltage of the on-board electrical system is dropped across the light-emitting diodes, which makes it possible to use the LED module in motor vehicles whilst dispensing with a series resistor that does not produce usable heat.

With the foregoing and other objects in view there is also provided, in accordance with the invention, a method for producing the LED module. First two mutually insulated metal areas are applied on a glass disk. The metal areas are suitable as an etching mask for anisotropic wet-chemical etching and may include, for example, an alloy of chromium and gold. Afterward, the glass disk is structured by anisotropic wet-chemical etching for the purpose of producing a glass body. For this purpose, an etching process using an etching mixture having hydrofluoric acid, nitric acid and/or ammonium fluoride is appropriate, in particular. This etching method is described in detail in International Publication WO 98/42628 which is hereby incorporated by reference.

The glass body is subsequently fixed on a silicon substrate by anodic bonding. The current required for the anodic bonding is impressed using the metal areas that were applied at the beginning of the production method.

Finally, in any desired order, the semiconductor component is fixed on the substrate and the substrate is fixed on the carrier body.

The method for producing the LED module has the advantage that the metal areas improve the impressing of the current during the anodic bonding. The metal areas that are suitable as an etching mask are applied and structured using customary methods in semiconductor technology. An appropriate glass disk is, in particular, borosilicate glass (BF 33) or a similar glass that is adapted to the extension coefficient of the silicon substrate.

The method can be configured particularly advantageously by using each metal area as a conductor area for contact-connecting the semiconductor components to the carrier body or the contact pin. This affords the advantage that specially applied conductor areas for the contact connection of the semiconductor components can be dispensed with.

With the foregoing and other objects in view there is also provided, in accordance with the invention, a method for producing the inventive LED module which allows a plurality of substrates with glass bodies fixed thereon to be produced in parallel (etching process). To that end, a masking area that is suitable as an etching mask is applied to a glass disk in such a way that a plurality of etching masks each belonging to a glass body are present in a chessboard-like arrangement on the glass disk. In this case, the etching masks need not necessarily be square, but rather may also be rectangular or round. All that is crucial is that they form a regular recurring pattern on the glass disk.

In a next step, all the glass bodies provided on the glass disk are structured simultaneously, thereby producing a plurality of contiguous glass bodies. Such simultaneous structuring can be effected for example by dipping the glass disk into the etching solution described further above.

In a next step, the glass disk is fixed on a silicon wafer in a planar manner, thereby producing a silicon-glass wafer. Before the fixing of the glass disk, the silicon wafer may have been processed by applying contact areas for the components. The planar fixing of the glass disk on the silicon wafer may be carried out, for example by anodic or eutectic bonding or else by adhesive bonding.

Afterward, radiation-emitting semiconductor components are fixed in the depressions belonging to a glass body on the corresponding silicon wafer section. By way of example, the semiconductor components may be adhesively bonded on by an silver conductive adhesive or may be fixed by laser soldering. Laser soldering additionally requires a gold-tin layer on the underside of the semiconductor component, which improves the thermal conductivity of the component fixing.

In a subsequent step, the silicon-glass wafer is cut up, to be precise, perpendicularly to the wafer plane along lines that separate the individual glass bodies from one another. As a result, a so-called submount is produced, which is fixed on a carrier body, for example a TO8 header, in a subsequent step. This fixing can be realized, for example, by an adhesive having good thermal conductivity.

The method for producing the LED module has the advantage that it allows for the simultaneous production of many glass bodies required for the module. As a result, large numbers of the module can be produced in a short time.

In a particularly advantageous embodiment of the production method, all of the depressions on the submount can be populated with semiconductor components. After sawing the silicon-glass wafer, a multiplicity of LED modules can be produced in a short time by gouging out and applying suction to the submounts using a suction needle and subsequent mounting on a carrier body.

Furthermore, in accordance with the invention, the LED module is used for laterally coupling light into an optical waveguide. On account of the particularly high brightness of the radiation emitted by the LED module, the LED module is particularly suitable for laterally coupling light into the end face of optical waveguides.

Other features which are considered as characteristic for the invention are set forth in the appended claims.

Although the invention is illustrated and described herein as embodied in a LED module, and respective methods for producing and using the module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagrammatic cross sectional view of an exemplary embodiment of a substrate populated with a glass body;

FIG. 3 is a plan view of the substrate shown in FIG. 2;

FIG. 4 is a diagrammatic cross sectional view of an exemplary embodiment of another substrate populated with a glass body; and FIG. 5 is a plan view of the substrate shown in FIG. 4.

DESCRIPTION OF THE PREFERRED EMBODIMENTS

Figure 1:
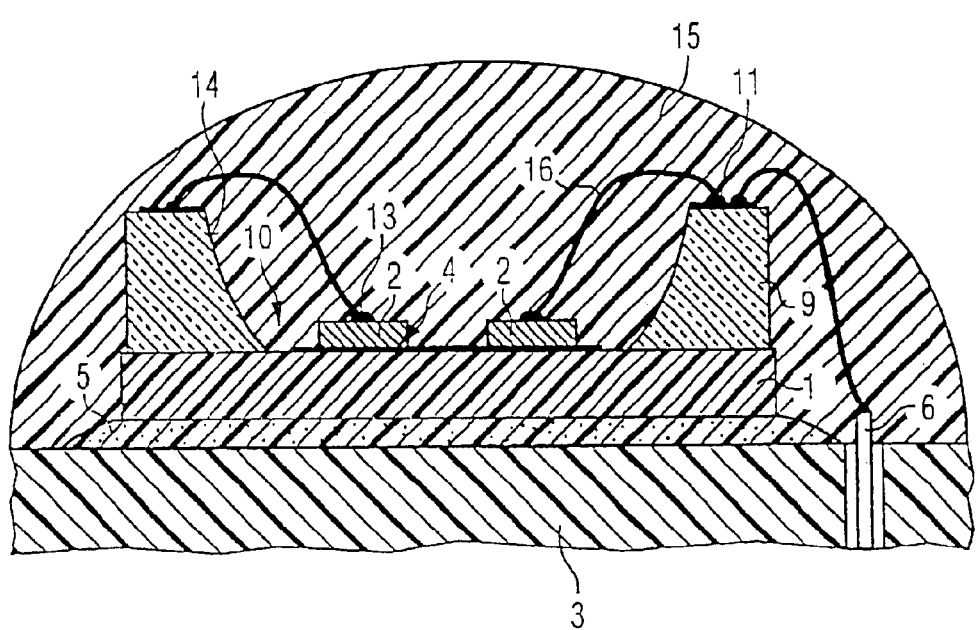
FIG. 1 is a diagrammatic cross sectional view of an exemplary embodiment of an LED module.

Referring now to the figures of the drawing in detail and first, particularly, to FIG. 1 thereof, there is shown a substrate 1, on which a plurality of radiation-emitting semiconductor components 2 are fixed. In this case, the component fixing 4 of the semiconductor components 2 is realized by a conductive adhesive. The substrate 1 is furthermore fixed on a carrier body 3. The substrate fixing 5 is effected using an adhesive having good thermal conductivity, for example, a silver conductive adhesive. The top side of the substrate 1 is partly covered by a glass body 9, which has a depression 10 partly uncovering the substrate 1.

Arranged on the top side of the glass body 9 is a first conductor area 11, which is contact-connected by bonding wires 16 to second pads 13 arranged on the top side of the semiconductor components 2. The first conductor area 11 is also contact-connected to a contact pin 6 that is arranged on the carrier body 3 and that is insulated from the carrier body 3. The inner areas 14 of the glass body 9 are configured as reflectors that allow the light that is laterally radiated from the semiconductor components 2 to be deflected and focused in such a way that it leaves the LED module perpendicularly to the substrate 1.

For the protection of the semiconductor components 2, the carrier body 3 is potted with an encapsulation 15 made of epoxy resin.

FIG. 2 shows a substrate 1 populated with a glass body 9, and two semiconductor components 2 fixed on the surface of the substrate 1. FIG. 2 reveals that the glass body 9 has two depressions 10, in each of which a semiconductor component 2 is arranged. Consequently, the inner areas 14 of the depressions 10 can each be adapted to the radiation characteristics of the semiconductor components 2.

As in FIG. 1, the top sides of the semiconductor components 2 are connected to the first conductor area 11 arranged on the top side of the glass body 9 by bonding wires 16. The top side of the substrate 1 furthermore has a contact area 7, which is connected to first pads arranged on the underside of the semiconductor components 2 or to a second conductor area arranged on the top side of the glass body 9 (cf. FIG. 3).

FIG. 3 reveals two further depressions 10 of the glass body 9 illustrated in FIG. 2. In total, the glass body 9 has four depressions 10, in each of which a semiconductor component 2 is arranged. The substrate 1 has contact areas 7, which make contact with the semiconductor components 2 from the underside and which are additionally provided with a free-standing contact area section 8 which allows the contact areas 7 to be externally contact-connected. A respective pad 13 on the top side of each of the semiconductor components 2 is connected to the first conductor area 11 on the glass body 9 by bonding wires 16.

The first conductor area 11 is connected by a bonding wire 16 to a contact pin 6 which projects through the carrier body 3. The contact areas 7 of the individual semiconductor components 2 are connected to one another by means of the free-standing contact area sections 8, so that a single bonding wire 16 suffices for contact-connecting all the semiconductor components 2 to the second conductor area 12 on their underside, the second conductor area in turn being contact-connected to the carrier body 3 by means of a bonding wire 16.

FIG. 4 shows a populated substrate 1 with a glass body 9 and two semiconductor components 2 fixed on the surface of the substrate 1. As in FIG. 1, the top sides of the semiconductor components 2 are connected to a first conductor area 11 arranged on the top side of the glass body 9 by bonding wires 16. In contrast to FIG. 2, only one depression 10 is provided, in which a plurality of semiconductor components 2 are arranged.

The top side of the substrate 1 furthermore has a contact area 7, which is connected to first pads arranged on the underside of the semiconductor components 2 or to a second conductor area arranged on the top side of the glass body 9 (cf. FIG. 5).

FIG. 5 shows two further semiconductor components 2 of the substrate 1 illustrated in FIG. 4. The substrate 1 has contact areas 7, which make contact with the undersides of the semiconductor components 2 and which are additionally provided with a free-standing contact area section 8 which allows the contact areas 7 to be contact-connected externally.

Each of the semiconductor components 2 is connected, from the top side, to the first conductor area 11 on the glass body 9 by bonding wires 16. The first conductor area 11 is again connected by a bonding wire 16 to a contact pin 6 that projects through the carrier body 3. The contact areas 7 of the individual semiconductor components 2 are connected to one another by the free-standing contact area sections 8, so that a single bonding wire 16 suffices for contact-connecting the undersides of all of the semiconductor components to the second conductor area 12. The second conductor area in turn is contact-connected to the carrier body 3 by a bonding wire 16.

The invention should not be construed as being restricted to the exemplary embodiments, which are shown merely to provide examples, but rather the invention is defined in its most general form by the claims.

We claim:

1. An LED module for illumination systems or signaling systems, the module comprising:
    a thermally conductive substrate having a top side and an underside;
    at least one radiation-emitting semiconductor component fixed on said top side of said substrate;
    a carrier body having a high thermal capacity, said underside of said substrate fixed on said carrier body, said carrier body being a metallic carrier;
    a contact pin configured in said carrier body and electrically insulated from said carrier body;
    a first component fixing located between said semiconductor component and said substrate; and
    a second component fixing located between said substrate and said carrier body;
    said first component fixing and second component fixing each having a good thermal conductivity such that heat produced during operation is dissipated via said carrier body.

2. The LED module according to claim 1, wherein said semiconductor component is selected from a group consisting of a light-emitting diode, a laser diode, a light-emitting diode chip, and a laser diode chip.

3. The LED module according to claim 1, wherein said semiconductor component is a vertically emitting semiconductor component.

4. The LED module according to claim 1, wherein said carrier body has a TO design.

5. The LED module according to claim 1, comprising:
    a contact area configured on said substrate, said contact area having a free-standing contact area section;
    said underside of said semiconductor component having a first pad contact-connected to said contact area by said first component fixing.

6. The LED module according to claim 1, wherein said substrate is made of silicon.

7. The LED module according to claim 6, comprising:
    a glass body;
    said substrate having a top side partly covered by said glass body;
    said glass body fixed on said top side of said substrate;
    said glass body formed with at least one depression uncovering said surface of said substrate; and
    said semiconductor component configured in said depression of said glass body.

8. The LED module according to claim 7, comprising:
    a plurality of radiation-emitting semiconductor components, said at least one radiation-emitting semiconductor component being at least one of said plurality of said radiation-emitting semiconductor components;

said glass body being formed with a plurality of depressions, said at least one depression being at least one of said plurality of said depressions; and each one of said plurality of said radiation-emitting semiconductor components being configured in a respective one of said plurality of said depressions.

9. The LED module according to claim 7, wherein said glass body is formed by anisotropic, wet-chemical etching.

10. The LED module according to claim 7, wherein said glass body is fixed on said substrate by anodic bonding.

11. The LED module according to claim 7, comprising:
a contact pin; and
a contact area configured on said substrate, said contact area having a free-standing contact area section;
said glass body having a top side formed with two mutually insulated conductor areas defining a first conductor area and a second conductor area;
said semiconductor component having a top side with a second pad;
said first conductor area being contact-connected to said second pad and to said contact pin; and
said second conductor area being contact-connected to said free-standing contact area section and to said carrier body.

12. The LED module according to claim 7, wherein:
said semiconductor component is a laterally emitting light-emitting diode or a laterally emitting laser diode;
said glass body has an inner area defined by said depression; and
said inner area is formed as a reflector for deflecting radiation emitted by said semiconductor component such that the radiation leaves the module perpendicularly to said substrate.

13. The LED module according to claim 7, comprising a metal layer covering said inner area of said depression.

14. The LED module according to claim 1, comprising an encapsulation potting said top side of said substrate and enclosing said semiconductor component.

15. The LED module according to claim 1, comprising:
a plurality of light-emitting diodes connected in series with one another and fixed on said substrate, said at least one semiconductor component being at least one of said plurality of said light-emitting diodes;
said plurality of said light-emitting diodes being of a type and a number such that a total voltage dropped across said plurality of said light-emitting diodes during operation corresponds to an operating voltage of a motor vehicle on-board electrical system.

16. The LED module according to claim 1, comprising:
a plurality of radiation-emitting semiconductor components fixed on said top side of said substrate;
said at least one radiation-emitting semiconductor component being at least one of said plurality of said radiation-emitting semiconductor components.

17. A method for producing an LED module, which comprises:
applying two mutually insulated metal areas, which are suitable as an etching mask, on a glass disk;
structuring the glass disk by anisotropic wet-chemical etching to produce a glass body;
fixing the glass body on a substrate made of silicon by anodic bonding, and using the metal areas to impress a current required for the anodic bonding; and
fixing at least one semiconductor component on the substrate and fixing the substrate on a carrier body.

18. The method according to claim 17, which comprises using each one of the metal areas as a conductor area for contact-connecting the semiconductor component to the carrier body or to a contact pin.

19. A method for producing an LED module, which comprises:
applying a plurality of masking areas on a glass disk such that a plurality of etching masks are present in a chessboard-like configuration on the glass disk, each one of the plurality of the etching masks corresponding to a glass body;
simultaneously structuring a plurality of glass bodies on the glass disk to produce a plurality of contiguous glass bodies;
planarly fixing the glass disk on a silicon wafer to produce a silicon-glass wafer;
fixing a plurality of semiconductor components in depressions of a glass body on a corresponding silicon wafer section;
cutting up the silicon-glass wafer perpendicular to a plane of the wafer along lines that separate the plurality of the glass bodies from one another; and
fixing the silicon wafer section having the plurality of the semiconductor components on a carrier body.

20. A method of using an LED module, which comprises:
providing an LED module including: a thermally conductive substrate having a top side and an underside; at least one radiation-emitting semiconductor component fixed on the top side of the substrate; a carrier body having a high thermal capacity, the underside of the substrate fixed on the carrier body, the carrier body being a metallic carrier; a contact pin configured in the carrier body and electrically insulated from the carrier body; a first component fixing located between the semiconductor component and the substrate; and a second component fixing located between the substrate and the carrier body, the first component fixing and the second component fixing each having a good thermal conductivity such that heat produced during operation is dissipated via the carrier body; and
using the LED module to laterally couple light into an optical waveguide.

21. An LED module for illumination systems or signaling systems, the module comprising:
a thermally conductive silicon substrate having a top side with a surface and an underside;
a glass body partly covering said top side of said substrate and fixed on said top side of said substrate, said glass body being formed with at least one depression uncovering said surface of said substrate;
at least one radiation-emitting semiconductor component fixed on said top side of said substrate, said semiconductor component being configured in said depression of said glass body;
a carrier body having a high thermal capacity, said underside of said substrate fixed on said carrier body;
a first component fixing located between said semiconductor component and said substrate; and
a second component fixing located between said substrate and said carrier body;
said first component fixing and second component fixing each having a good thermal conductivity for dissipating heat produced during operation via said carrier body.

* * * * *